US010593290B2

(12) United States Patent
Yamada

(10) Patent No.: US 10,593,290 B2
(45) Date of Patent: Mar. 17, 2020

(54) DRIVING CIRCUIT AND ELECTRONIC DEVICE

(71) Applicant: SEIKO EPSON CORPORATION, Tokyo (JP)

(72) Inventor: Toshimichi Yamada, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 56 days.

(21) Appl. No.: 15/928,241

(22) Filed: Mar. 22, 2018

(65) Prior Publication Data

US 2018/0277057 A1    Sep. 27, 2018

(30) Foreign Application Priority Data

Mar. 23, 2017   (JP) .................................. 2017-057146

(51) Int. Cl.
  *G09G 5/02*   (2006.01)
  *H01L 27/12*   (2006.01)
  *G02F 1/1362*   (2006.01)
  *G02F 1/133*   (2006.01)
  *G02F 1/1368*   (2006.01)
  (Continued)

(52) U.S. Cl.
  CPC ............. *G09G 5/02* (2013.01); *G02F 1/1368* (2013.01); *G02F 1/13306* (2013.01); *G02F 1/136286* (2013.01); *G09G 3/2011* (2013.01); *G09G 3/3696* (2013.01); *H01L 27/124* (2013.01); *G02F 2203/30* (2013.01); *G09G 3/3655* (2013.01); *G09G 2330/021* (2013.01); *H01L 27/3276* (2013.01)

(58) Field of Classification Search
  CPC ...... G09G 3/2011; G09G 3/3696; G09G 5/02; G02F 1/13306; G02F 1/1368; G02F 1/136286; H01L 27/124
  USPC ...................... 345/76, 87, 89, 206, 690, 691
  See application file for complete search history.

(56) References Cited

U.S. PATENT DOCUMENTS 8,223,514 B2    7/2012   Kajino
2004/0233226 A1*  11/2004  Toriumi ............... G09G 3/3648
                                                       345/690

(Continued)

FOREIGN PATENT DOCUMENTS

JP    2014-003786 A    1/2014
JP    5600881 B2    10/2014
(Continued)

*Primary Examiner* — Prabodh M Dharia
(74) *Attorney, Agent, or Firm* — Oliff PLC

(57) ABSTRACT

This driving circuit includes a data line driving circuit that supplies a gray-scale signal to a plurality of data lines, a regulator that stabilizes a supplied power supply voltage and supplies the stabilized power supply voltage to a smoothing capacitor and the data line driving circuit, a switching circuit that switches the connection state of a plurality of circuit elements that constitute the regulator, and a control circuit that controls the switching circuit. The control circuit controls the switching circuit so as to set voltage stabilization capability of the regulator to a predetermined level when the gray-scale signal is supplied to pixel elements, and controls the switching circuit so as to set the voltage stabilization capability of the regulator to a level lower than the predetermined level or to stop an operation of the regulator, when the gray-scale signal is not supplied to the pixel elements.

17 Claims, 5 Drawing Sheets

(51) Int. Cl.
    *G09G 3/36*    (2006.01)
    *G09G 3/20*    (2006.01)
    *H01L 27/32*   (2006.01)

(56) References Cited

U.S. PATENT DOCUMENTS

| | | | |
|---|---|---|---|
| 2006/0077491 A1* | 4/2006 | Morita | G09G 3/3611 |
| | | | 358/519 |
| 2006/0092185 A1* | 5/2006 | Jo | G09G 3/3233 |
| | | | 345/690 |
| 2006/0158395 A1* | 7/2006 | Kubota | G09G 3/3258 |
| | | | 345/76 |
| 2008/0238843 A1* | 10/2008 | Yatabe | G09G 3/3655 |
| | | | 345/87 |
| 2009/0009446 A1* | 1/2009 | Kamijo | G09G 3/3655 |
| | | | 345/87 |
| 2009/0237337 A1* | 9/2009 | Nomizo | G09G 3/2096 |
| | | | 345/89 |
| 2009/0267871 A1 | 10/2009 | Tanabe | |
| 2010/0176770 A1* | 7/2010 | Fortmann | H02J 3/1885 |
| | | | 323/205 |
| 2010/0277402 A1* | 11/2010 | Miyazawa | G09G 3/3233 |
| | | | 345/76 |
| 2011/0267323 A1* | 11/2011 | Fujikawa | G09G 3/3648 |
| | | | 345/206 |
| 2014/0125716 A1* | 5/2014 | Kurokawa | G09G 3/2011 |
| | | | 345/691 |
| 2014/0192096 A1* | 7/2014 | Maruyama | G09G 3/3666 |
| | | | 345/690 |
| 2015/0179104 A1* | 6/2015 | Miyazawa | G09G 3/3233 |
| | | | 345/212 |
| 2016/0337539 A1 | 11/2016 | Masuda et al. | |

FOREIGN PATENT DOCUMENTS

| | | |
|---|---|---|
| JP | 2015-018028 A | 1/2015 |
| JP | 2016-214007 A | 12/2016 |
| WO | 2008-032552 A1 | 3/2008 |

\* cited by examiner

DRIVING CIRCUIT AND ELECTRONIC DEVICE

CROSS-REFERENCE TO RELATED APPLICATION

This patent application claims the benefit of the Japanese Patent Application No. 2017-57146, filed on Mar. 23, 2017. The content of the aforementioned application is hereby incorporated herein by reference in its entirety.

BACKGROUND

1. Technical Field

The present invention relates to a driving circuit for driving an electro-optical panel, such as a liquid-crystal display panel, and relates to an electronic device using such a driving circuit, and the like.

2. Related Art

For example, a driving circuit for driving a plurality of TFTs (thin-film transistors) provided on a liquid-crystal display panel generates gray-scale signals that have voltages corresponding to pieces of image data and supplies the generated gray-scale signals to a plurality of data lines, and also generates scan signals for scanning a plurality of lines on the liquid-crystal display panel and supplies the generated scan signals to a plurality of scan lines. For this purpose, a power supply circuit is required that includes a voltage boosting circuit for boosting a power supply voltage supplied from a battery or the like, and a regulator for stabilizing the power supply voltage supplied from the voltage boosting circuit.

In known driving circuits that are provided with such a power supply circuit, the voltage boosting circuit and the regulator constantly operate, resulting in large power consumption of the power supply circuit. To reduce power consumption of the power supply circuit, an attempt to reduce a constant operational current of the regulator has been made. However, there is a limit to reducing the operational current without degrading the ability to drive the liquid-crystal display panel.

WO2008/032552 (paragraphs 0001-0008, FIGS. 1 to 5) discloses, as a related technique, a switching circuit using a TFT, and a pixel driving circuit using this switching circuit. This switching circuit includes at least two FETs that are connected in series between an input terminal and an output terminal, and a driving unit for alternately driving these FETs to enter an OFF state when there is an OFF command, and simultaneously driving these FETs to enter an ON state when there is an ON command.

With the switching circuit in WO2008/032552, when the TFTs are kept in the OFF state, it is possible to reduce a change in the threshold voltage of the TFTs due to the influence of gate stress generated as a result of continuing to apply a constant bias voltage between gates and sources of the TFTs. However, since a plurality of scan lines need to be driven in order to alternately cause the at least two TFTs to enter the OFF state, power consumption of the regulator that supplies the power supply voltage to the driving unit increases.

SUMMARY

A first advantage of some aspects of the invention lies in reducing power consumption of a driving circuit that is provided with a regulator for stabilizing a supplied power supply voltage, without degrading the ability to drive an electro-optical panel. In particular, in a driving circuit that drives a plurality of scan lines in order to alternately cause a plurality of transistors that are connected in series in a pixel circuit to enter an OFF state, a reduction in power consumption of the entire driving circuit is desired. A second advantage of some aspects of the invention lies in the provision of an electronic device using such a driving circuit, or the like.

A driving circuit according to a first aspect of the invention is a driving circuit for driving an electro-optical panel that includes a plurality of scan lines, a plurality of data lines, and a plurality of pixel circuits each including a plurality of pixel elements, the plurality of pixel circuits being provided corresponding to intersections of the plurality of scan lines and the plurality of data lines, the driving circuit comprising: a data line driving circuit that supplies a gray-scale signal to the plurality of data lines; a regulator that stabilizes a supplied power supply voltage and supplies the stabilized power supply voltage to a smoothing capacitor and the data line driving circuit; a switching circuit that switches a connection state of a plurality of circuit elements that constitute the regulator; and a control circuit that controls the switching circuit, wherein the control circuit controls the switching circuit so as to set a voltage stabilization capability of the regulator to a predetermined level when the gray-scale signal is supplied to the plurality of pixel elements, and controls the switching circuit so as to set the voltage stabilization capability of the regulator to a level lower than the predetermined level or to stop an operation of the regulator, when the gray-scale signal is not supplied to the plurality of pixel elements.

According to the first aspect of the invention, when the gray-scale signal is not supplied to the plurality of pixel elements, the voltage stabilization capability of the regulator for supplying the stabilized power supply voltage to the data line driving circuit is set to a level lower than the level at the time of supplying the gray-scale signal, or the operation of the regulator is stopped. Accordingly, power consumption can be reduced without degrading the capability to drive the electro-optical panel.

Here, in a first mode of driving the electro-optical panel at a predetermined frame rate, the control circuit may control the switching circuit so as to set the voltage stabilization capability of the regulator to a predetermined level, when the gray-scale signal is supplied to the plurality of pixel elements, and, in a second mode of driving the electro-optical panel at a frame rate higher than the predetermined frame rate, the control circuit may control the switching circuit so as to set the voltage stabilization capability of the regulator to a level higher than the predetermined level, when the gray-scale signal is supplied to the plurality of pixel elements. Thus, in the second mode, the capability to drive the electro-optical panel can be kept at a high level. In the first mode in which the frame rate is lower than that in the second mode, power consumption of the driving circuit can be made lower than that in the second mode.

Also, during a front porch period and a back porch period, the control circuit may control the switching circuit so as to set the voltage stabilization capability of the regulator to a level lower than the predetermined level or to stop the operation of the regulator. Since the gray-scale signal is not supplied to the plurality of pixel elements during the front porch period and the back porch period, power consumption can be reduced without degrading the capability to drive the electro-optical panel.

Furthermore, the regulator may include: a differential amplifier circuit for amplifying a difference between a reference voltage and an output voltage of the regulator; a plurality of constant current transistors for supplying a constant current to the differential amplifier circuit; and a plurality of output transistors for generating the output voltage of the regulator in accordance with an output signal of the differential amplifier circuit, and the switching circuit may include: a first selection circuit that selects the number of constant current transistors for supplying the constant current to the differential amplifier circuit; and a second selection circuit that selects the number of output transistors for generating the output voltage of the regulator. Thus, the voltage stabilization capability of the regulator can be set to one of a plurality of levels, or the operation of the regulator can be stopped.

In the above-described configuration, a second regulator that stabilizes a supplied power supply voltage and supplies the stabilized power supply voltage to a second smoothing capacitor and a common electrode of the electro-optical panel and a second switching circuit that switches a connection state of a plurality of circuit elements that constitute the second regulator may further be comprised. The control circuit may control the second switching circuit so as to set a voltage stabilization capability of the second regulator to a predetermined level when the gray-scale signal is supplied to the plurality of pixel elements, and control the second switching circuit so as to set the voltage stabilization capability of the second regulator to a level lower than the predetermined level or to stop an operation of the second regulator, when the gray-scale signal is not supplied to the plurality of pixel elements.

In this case, when the gray-scale signal is not supplied to the plurality of pixel elements, the voltage stabilization capability of the second regulator for supplying the stabilized power supply voltage to the common electrode of the electro-optical panel is set to a level lower than that at the time of supplying the gray-scale signal, or the operation of the second regulator is stopped. Accordingly, power consumption can be reduced without degrading the capability to drive the electro-optical panel.

Also, a scan line driving circuit that supplies a scan signal to the plurality of scan lines; a third regulator that stabilizes a supplied power supply voltage and supplies the stabilized power supply voltage to a third smoothing capacitor and a voltage boosting circuit; and a third switching circuit that switches a connection state of a plurality of circuit elements that constitute the third regulator may further be comprised. The voltage boosting circuit may boost the power supply voltage stabilized by the third regulator, and supply the boosted power supply voltage to a fourth smoothing capacitor and the scan line driving circuit. In a first mode of driving the electro-optical panel at a predetermined frame rate, the control circuit may control the third switching circuit so as to set a voltage stabilization capability of the third regulator to a predetermined level, when the gray-scale signal is supplied to the plurality of pixel elements, and, in a second mode of driving the electro-optical panel at a frame rate higher than the predetermined frame rate, the control circuit may control the third switching circuit so as to set the voltage stabilization capability of the third regulator to a level higher than the predetermined level, when the gray-scale signal is supplied to the plurality of pixel elements, Thus, in the second mode, the capability to drive the electro-optical panel can be kept at a high level. In the first mode in which the frame rate is lower than that in the second mode, power consumption of the driving circuit can be made lower than that in the second mode.

Furthermore, each of the plurality of pixel circuits may include a plurality of transistors connected in series between one of the plurality of data lines and one of the plurality of pixel elements, and the scan line driving circuit may simultaneously control the plurality of transistors in pixel circuits on a sequentially selected pixel row to enter an ON state, and, when no pixel row is selected, the scan line driving circuit may alternately control the plurality of transistors on pixel circuits on a plurality of pixel rows to enter an OFF state. Thus, gate stress on the plurality of transistors in the pixel circuits is mitigated, and accordingly, a change in the threshold voltage of these transistors can be reduced.

A driving circuit according to a second aspect of the invention is a driving circuit for driving an electro-optical panel that includes a first scan line, a second scan line, a plurality of data lines, and a plurality of pixel circuits provided corresponding to intersections of the first and second scan lines and the plurality of data lines, each of the plurality of pixel circuits including a pixel electrode, a common electrode, a first transistor that is electrically connected to one of the plurality of data lines and is controlled by the first scan line, and a second transistor that is electrically connected between the first transistor and the pixel electrode and is controlled by the second scan line, the driving circuit comprising: a data line driving circuit that supplies a gray-scale signal to the plurality of data lines; a first voltage generation circuit that supplies a power supply voltage to the data line driving circuit; a scan line driving circuit that supplies a scan signal to the first and second scan lines; and a second voltage generation circuit that supplies a power supply voltage to the scan line driving circuit, wherein, during a first period of alternately causing the first transistor and the second transistor to enter an OFF state, the first voltage generation circuit is stopped and the second voltage generation circuit is operated, and, during a second period of simultaneously causing the first transistor and the second transistor to enter an ON state, the first voltage generation circuit and the second voltage generation circuit are operated.

According to the second aspect of the invention, during the first period of alternately causing the first transistor and the second transistor to enter the OFF state, the first voltage generation circuit for supplying the power supply voltage to the data line driving circuit stops. Accordingly, power consumption can be reduced while displaying an immediately previous image on the electro-optical panel.

An electronic device according to a third aspect of the invention includes: any one of the above-described driving circuits; and an electro-optical panel driven by the driving circuit. According to the third aspect of the invention, an electronic device in which power consumption is reduced while maintaining favorable image quality can be provided, by using the driving circuit capable of reducing power consumption, without degrading the capability to drive the electro-optical panel.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described in detail with reference to the drawings. Note that the same constituent elements are assigned the same reference signs, and redundant descriptions are omitted.

Driving Circuit

Figure 1:
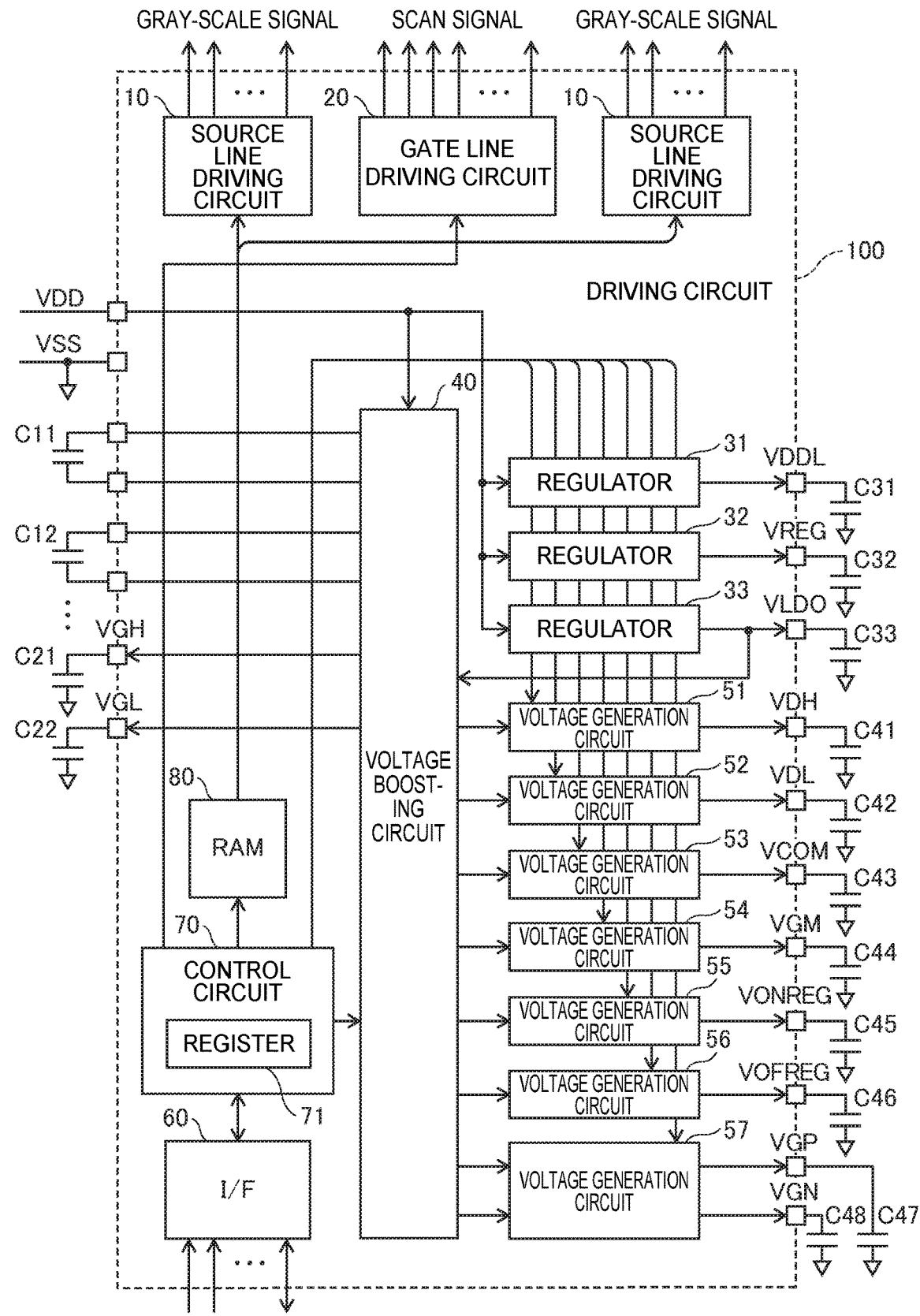
FIG. 1 is a block diagram showing a configuration example of a driving circuit according to an embodiment of the invention.

FIG. 1 is a block diagram showing a configuration example of a driving circuit according to an embodiment of the invention. A driving circuit 100 operates while receiving a power supply potential VDD on a high potential side and a power supply potential VSS on a low potential side that are supplied from the outside, and drives an electro-optical panel, such as an LCD (liquid-crystal display) panel or an organic EL (electroluminescence) panel. FIG. 1 shows the case where the power supply potential VSS is a ground potential (0 V). The power supply potential VDD is 3.3 V, for example.

As shown in FIG. 1, the driving circuit 100 includes a source line driving circuit (also called a data line driving circuit) 10, a gate line driving circuit (also called a scan line driving circuit) 20, a plurality of regulators 31 to 33, a voltage boosting circuit 40, a plurality of voltage generation circuits 51 to 57, an interface (I/F) 60, a control circuit 70, and a RAM (random access memory) 80.

FIG. 1 shows an example in which the driving circuit 100 is contained in one semiconductor device (display driver IC). However, the driving circuit 100 may also be at least partially constituted by a plurality of discrete parts or other ICs. Voltage boosting capacitors C11, C12, . . . , and smoothing capacitors C21 to C48 are connected between the driving circuit 100 and an interconnect with the power supply potential VSS.

A description will be given below of the case of using, as the electro-optical panel, an LCD panel in which a plurality of TFTs are provided. The driving circuit 100 drives the LCD panel that includes a plurality of gate lines (also called scan lines), which are arranged in a plurality of rows, a plurality of source lines (also called data lines), which are arranged in a plurality of columns, and a plurality of pixel circuits, which are provided corresponding to intersections between the plurality of gate lines and the plurality of source lines, each pixel circuit including a plurality of pixel elements. Source line driving circuits 10 each supply gray-scale signals to the plurality of source lines that are connected to the plurality of pixel circuits, and the gate line driving circuit 20 supplies scan signals to the plurality of gate lines that are connected to the plurality of pixel circuits.

The regulators 31 to 33 stabilize power supply voltages (VDD-VSS), and generate stabilized power supply voltages VDDL, VREG, and VLDO. The smoothing capacitors C31 to C33 smooth the power supply voltages VDDL, VREG, and VLDO, respectively. The power supply voltage VDDL is supplied to a logic circuit in the driving circuit 100. The power supply voltage VREG is used as a reference voltage in the driving circuit 100. The power supply voltage VLDO is supplied to the voltage boosting circuit 40 and is used as a power supply voltage to be boosted.

The voltage boosting circuit 40 includes a plurality of charge-pump circuits. These charge-pump circuits perform a voltage boosting operation using the voltage boosting capacitors C11, C12, . . . , in accordance with a voltage boosting clock signal, which is supplied from the control circuit 70. For example, the voltage boosting circuit 40 generates a plurality of power supply voltages by boosting (or dropping) the power supply voltages (VDD-VSS) or the power supply voltage VLDO supplied from a regulator 33, with positive polarity or negative polarity, and supplies the generated power supply voltages to the voltage generation circuits 51 to 57.

The voltage generation circuit 51 stabilizes a power supply voltage supplied from the voltage boosting circuit 40, and supplies a stabilized power supply voltage VDH (e.g. +5 V) to the smoothing capacitor C41 and the source line driving circuits 10. The voltage generation circuit 52 stabilizes a power supply voltage supplied from the voltage boosting circuit 40, and supplies a stabilized power supply voltage VDL (e.g. −5 V) to the smoothing capacitor C42 and the source line driving circuits 10.

The voltage generation circuit 53 stabilizes a power supply voltage supplied from the voltage boosting circuit 40, and supplies a stabilized power supply voltage VCOM (e.g. −0.4 V) to the smoothing capacitor C43 and common electrodes of the LCD panel. The voltage generation circuit 54 stabilizes a power supply voltage supplied from the voltage boosting circuit 40, and supplies a stabilized power supply voltage VGM (e.g. +7 V) to the smoothing capacitor C44 and the gate line driving circuit 20.

The voltage generation circuit 55 stabilizes a power supply voltage supplied from the voltage boosting circuit 40, and supplies a stabilized power supply voltage VONREG to a smoothing capacitor C45 and the voltage boosting circuit 40. The voltage boosting circuit 40 boosts the power supply voltage VONREG supplied from the voltage generation circuit 55, and thus generates a boosted power supply voltage VGH (e.g. +15 V) and supplies the generated power supply voltage VGH to the smoothing capacitor C21 and the gate line driving circuit 20.

The voltage generation circuit 56 stabilizes a power supply voltage supplied from the voltage boosting circuit 40, and supplies a stabilized power supply voltage VOFREG to the smoothing capacitor C46 and the voltage boosting circuit 40. The voltage boosting circuit 40 boosts the power supply voltage VOFREG supplied from the voltage generation circuit 56, and thus generates a power supply voltage VGL (e.g. −10 V) and supplies the generated power supply voltage VGL to the smoothing capacitor C22 and the gate line driving circuit 20.

The voltage generation circuit 57 stabilizes a plurality of power supply voltages supplied from the voltage boosting circuit 40, and supplies a stabilized power supply voltage VGP to the smoothing capacitor C47 and the source line driving circuits 10, and also supplies a stabilized power supply voltage VGN to the smoothing capacitor C48 and the source line driving circuits 10.

Here, the power supply voltages VGP and VGN represent a plurality of power supply voltages VGP1, VGP2, . . . , and a plurality of power supply voltages VGN1, VGN2, . . . , respectively, which are used to generate a plurality of gray-scale signals having halftones that have been subjected to y correction. The number of these power supply voltages is determined in accordance with the number of bits of image data.

Accordingly, the smoothing capacitor C47 represents a plurality of smoothing capacitors for smoothing the plurality of power supply voltages VGP1, VGP2, . . . , and the smoothing capacitor C48 represents a plurality of smoothing capacitors for smoothing the plurality of power supply voltages VGN1, VGN2, . . . .

The interface 60 communicates with an external host controller, for example, and thus receives input of image data, a timing parameter, various control signals, and the like, from the host computer. The control circuit 70 is constituted by a logic circuit that includes a combinational circuit or a sequential circuit, and includes a register 71 for storing timing parameters and the like supplied from the host controller.

The control circuit 70 sets an operational timing of the driving circuit 100 to control each unit in the driving circuit 100, in accordance with the timing parameters stored in the register 71. The control circuit 70 processes the image data supplied from the host controller and temporarily stores the processed image data in the RAM 80.

Voltage Generation Circuit

Figure 2:
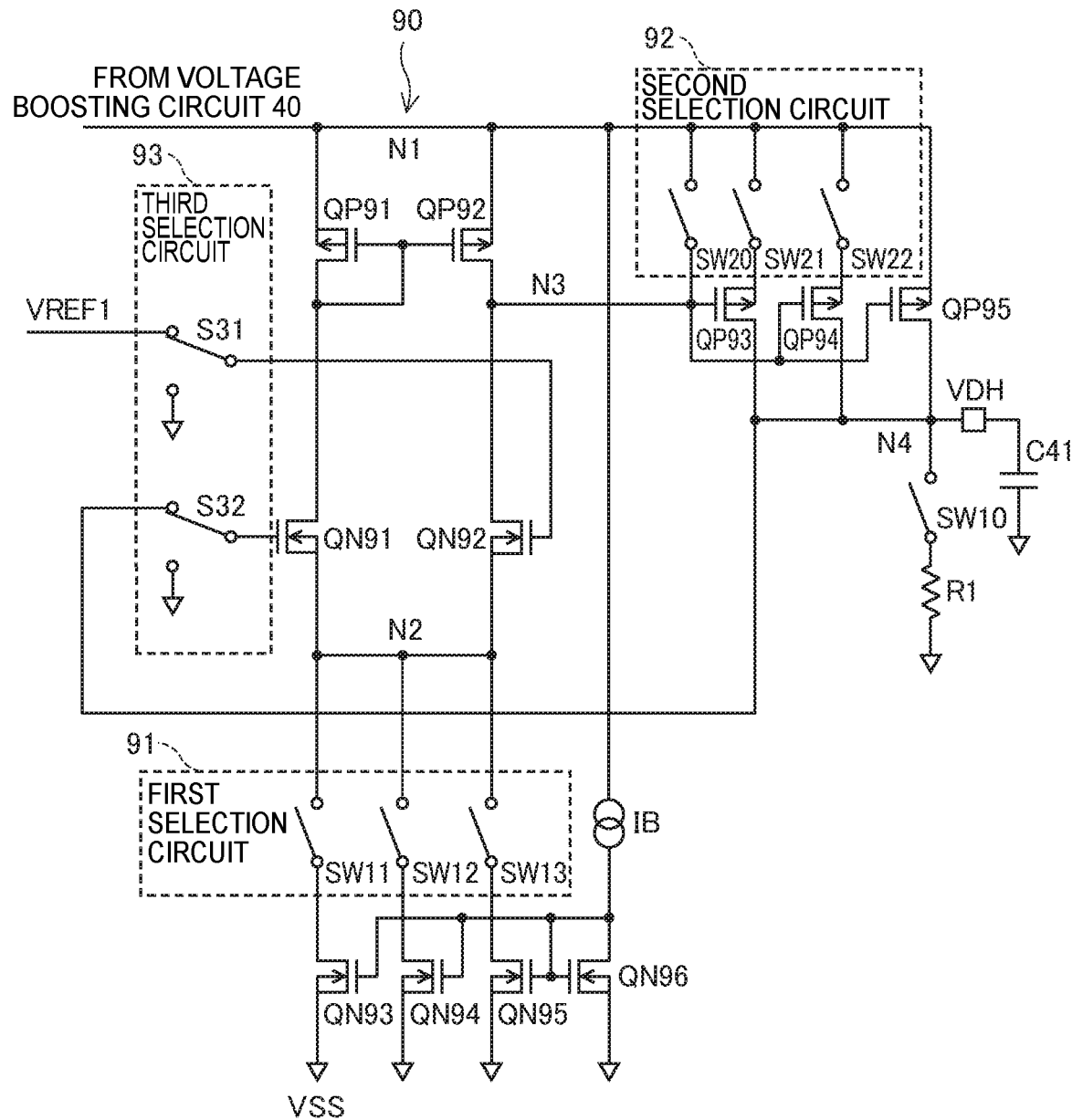
FIG. 2 is a circuit diagram showing a configuration example of a voltage generation circuit shown in FIG. 1.

FIG. 2 is a circuit diagram showing a configuration example of the voltage generation circuit shown in FIG. 1. FIG. 2 shows the voltage generation circuit 51 shown in FIG. 1, as an example. The voltage generation circuit 51 includes a regulator for stabilizing a power supply voltage that is supplied from the voltage boosting circuit 40 to a node N1, and supplying the stabilized power supply voltage VDH to the smoothing capacitor C41 and the source line driving circuits 10 (FIG. 1), and a switching circuit for switching the connection state of a plurality of circuit elements that constitute the regulator.

The regulator includes a differential amplifier circuit 90 for amplifying the difference between a reference voltage VREF1 and an output voltage (power supply voltage VDH) from the regulator. The differential amplifier circuit 90 includes N-channel MOS transistors QN91 and QN92 that constitute a differential pair, and P-channel MOS transistors QP91 and QP92 that constitute a current mirror circuit, for example.

Sources of the transistors QN91 and QN92 are connected to each other at a node N2. The transistor QP91 has a source that is connected to the node N1, and a drain and a gate that are connected to a drain of the transistor QN91. The transistor QP92 has a source that is connected to the node N1, a drain that is connected to the drain QN92, and a gate that is connected to a drain and a source of the transistor QP91. An output signal of the differential amplifier circuit 90 is generated at a node N3, which is a node between the drain of the transistor QN92 and the drain of the transistor QP92.

The regulator includes a plurality of constant current transistors (in FIG. 2, N-channel MOS transistors QN93 to QN95 are shown as an example) for supplying a constant current to the differential amplifier circuit 90. Each of the transistors QN93 to QN95 constitutes a current mirror circuit together with an N-channel MOS transistor QN96.

Each of the transistors QN93 to QN95 has a gate that is connected to a drain and a gate of the transistor QN96, and a source that is connected to an interconnect with the power supply potential VSS. The transistor QN96 has the drain and the gate that are connected to the node N1 via a constant current source IB, and a source that is connected to the interconnect with the power supply potential VSS.

When a constant current flows through the transistor QN96 from the constant current source 1B, the constant current also flows through the transistors QN93 to QN95. Here, the values of the constant currents supplied by the transistors QN93 to QN95 can be set in accordance with the ratio of the size (channel width or channel length) between the transistor QN96 and the transistors QN93 to QN95. In the following description, it is assumed that a relationship holds in which the channel width of the transistor QN93>the channel width of the transistor QN94>the channel width of the transistor QN95, and the transistors QN93 to QN95 have the same channel length.

Furthermore, the regulator includes a plurality of output transistors (in FIG. 2, P-channel MOS transistors QP93 to QP95 are shown as an example) for generating an output voltage of the regulator in accordance with the output signal of the differential amplifier circuit 90. Here, the current supply capability of the transistors QP93 to QP95 can be set in accordance with the size (channel width or channel length) of the transistors QP93 to QP95. In the following description, it is assumed that a relationship holds in which the channel width of the transistor QP93>the channel width of the transistor QP94>the channel width of the transistor QP95, and the transistors QP93 to QP95 have the same channel length.

Each of the transistors QP93 to QP95 has a gate that is connected to the node N3, and a drain that is connected to a node N4. The output voltage of the regulator is generated at the node N4. A switch circuit SW10 and a resistor R1 are connected in series between the node N4 and the interconnect with the power supply potential USS. When the driving circuit 100 is shut down, the switch circuit SW10 enters an ON state in accordance with a control signal that is supplied from the control circuit 70 shown in FIG. 1 and electric charges that have been stored in the smoothing capacitor C41 are discharged.

In the example shown in FIG. 2, the switching circuit includes a first selection circuit 91 for selecting the number of constant current transistors to supply a constant current to the differential amplifier circuit 90, and a second selection circuit 92 for selecting the number of output transistors to generate the output voltage of the regulator. Thus, the voltage stabilization capability of the regulator can be set to one of a plurality of levels, or the operation of the regulator can be stopped.

The switching circuit may also include a third selection circuit 93 for muting an input voltage of the regulator. The third selection circuit 93 includes selectors S31 and S32 that are constituted by a plurality of analog switches, for example. The selector S31 selects one of the reference voltage VREF1 and the power supply potential VSS and applies the selected voltage to a non-inverting input terminal (the gate of the transistor QN92) of the regulator. The selector S32 selects one of the output voltage of the regulator and the power supply potential VSS and applies the selected voltage to an inverting input terminal (the gate of the transistor QN91) of the regulator.

When causing the regulator to operate, the control circuit 70 controls the selectors S31 and S32 so as to select the reference voltage VREF1 and the output voltage of the regulator, respectively.

Thus, the reference voltage VREF1 is supplied to the non-inverting input terminal of the regulator, and the output voltage of the regulator is fed back to the inverting input terminal. Accordingly, the regulator controls the output voltage so that the output voltage is substantially equal to the reference voltage VREF1 even if the load changes.

The first selection circuit 91 includes switch circuits SW11 to SW13, which are connected between the node N2 and the drains of the transistors QN93 to QN95, respectively. The switch circuits SW11 to SW13 are constituted by N-channel MOS transistors or analog switches, for example. The switch circuits SW11 to SW13 enter the ON state or OFF state in accordance with three control signals that are supplied from the control circuit 70 shown in FIG. 1.

For example, when setting the voltage stabilization capability of the regulator to a first level, the control circuit 70 may also control only the switch circuit SW11 to enter the ON state. Thus, the transistor QN93 supplies a constant current to the differential amplifier circuit 90, and the differential amplifier circuit 90 amplifies the difference between the reference voltage VREF1 and the output voltage of the regulator to generate an output signal. Since the channel width of the transistor QN93 is the largest, a large constant current is supplied to the differential amplifier circuit 90. As a result, response speed, i.e. capability to follow a load change in the differential amplifier circuit 90 increases, and the voltage stabilization capability of the regulator increases accordingly.

When setting the voltage stabilization capability of the regulator to a second level that is lower than the first level, the control circuit 70 may also control only the switch circuit SW12 to enter the ON state. When setting the voltage stabilization capability of the regulator to a third level that is lower than the second level, the control circuit 70 may also control only the switch circuit SW13 to enter the ON state.

Furthermore, if the control circuit 70 controls the switch circuits SW11 to SW13 to enter the OFF state, the constant current is no longer supplied to the differential amplifier circuit 90, and the regulator stops the voltage control operation. At this time, the control circuit 70 may also control the selectors S31 and S32 in the third selection circuit 93 so as to select the power supply potential VSS. Thus, the potential at each unit in the differential amplifier circuit 90 is stabilized.

The second selection circuit 92 includes a switch circuit SW20 that is connected between the node N1 and the node N3, and switch circuits SW21 and SW22 that are connected between the node N1 and sources of the transistors QP93 and QP94, respectively. The switch circuits SW20 to SW22 are constituted by P-channel MOS transistors or analog switches, for example. The switch circuits SW20 to SW22 enter an ON state or OFF state in accordance with three control signals that are supplied from the control circuit 70 shown in FIG. 1. Note that a source of the transistor QP95 is directly connected to the node N1 without being connected via a switch circuit.

For example, when setting the voltage stabilization capability of the regulator to the first level, the control circuit 70 may also control the switch circuit SW20 to enter the OFF state and control the switch circuits SW21 and SW22 to enter the ON state. In this case, the sources of the transistors QP93 and QP94 are electrically connected to the node N1, and the transistors QP93 to QP95 generate the output voltage of the regulator in accordance with the output signal of the differential amplifier circuit 90. Thus, current supply capability at an output stage, i.e. the capability to follow a load change increases, and the voltage stabilization capability of the regulator increases accordingly.

When setting the voltage stabilization capability of the regulator to the second level that is lower than the first level, the control circuit 70 may also control only the switch circuit SW22 to enter the ON state. When setting the voltage stabilization capability of the regulator to the third level that is lower than the second level, the control circuit 70 may also control the switch circuits SW20 to SW22 to enter the OFF state.

Furthermore, if the switch circuit SW20 is controlled to enter the ON state, the power supply voltage at the node N1 is applied to the gates of the transistors QP93 to QP95, and the transistors QP93 to QP95 are cut off. As a result, the output operation of the regulator stops, and an output terminal of the voltage generation circuit 51 enters a high impedance state. Even in this case, electric charges are stored in the smoothing capacitor C41, and accordingly, the output voltage of the voltage generation circuit 51 is maintained unless a current flows through the source line driving circuits 10 (FIG. 1).

Similarly, the voltage generation circuit 53 shown in FIG. 1 includes a regulator (second regulator) for stabilizing the power supply voltage supplied from the voltage boosting circuit 40, and supplying the stabilized power supply voltage VCOM to the smoothing capacitor C43 (second smoothing capacitor) and the common electrodes of the LCD panel, and a switching circuit (second switching circuit) for switching the connection state of a plurality of circuit elements that constitute this regulator.

Each of the voltage generation circuits 55 and 56 shown in FIG. 1 includes a regulator (third regulator) for stabilizing the power supply voltage supplied from the voltage boosting circuit 40 and supplying the stabilized power supply voltage VONREG or VONREF to the smoothing capacitor C45 or C46 (third smoothing capacitor) and the voltage boosting circuit 40, and a switching circuit (third switching circuit) for switching the connection state of a plurality of circuit elements that constitute this regulator.

The voltage boosting circuit 40 boosts the power supply voltage VONREG that has been stabilized by the regulator in the voltage generation circuit 55, and supplies the boosted power supply voltage UGH to the smoothing capacitor C21 (fourth smoothing capacitor) and the gate line driving circuit 20. The voltage boosting circuit 40 also boosts the power supply voltage VOFREG that has been stabilized by the regulator in the voltage generation circuit 56, and supplies the boosted power supply voltage VGL to the smoothing capacitor C22 (fourth smoothing capacitor) and the gate line driving circuit 20.

The configuration of the voltage generation circuits 54 and 55 shown in FIG. 1 may also be the same as the configuration of the voltage generation circuit 51 shown in FIG. 2. Meanwhile, the configuration of the voltage generation circuits 52, 53, and 56 is the configuration of the voltage generation circuit 51 shown in FIG. 2 in which the P-channel MOS transistors and the N-channel MOS transistors are replaced with each other in order to stabilize a minus power supply voltage, in place of a plus power supply voltage. The voltage generation circuit 57 includes a plurality of sets of a regulator and a switching circuit for stabilizing a plus power supply voltage, and a plurality of sets of a regulator and a switching circuit for stabilizing a minus power supply voltage, depending on the number of bits of image data.

Pixel Circuit

Figure 3:
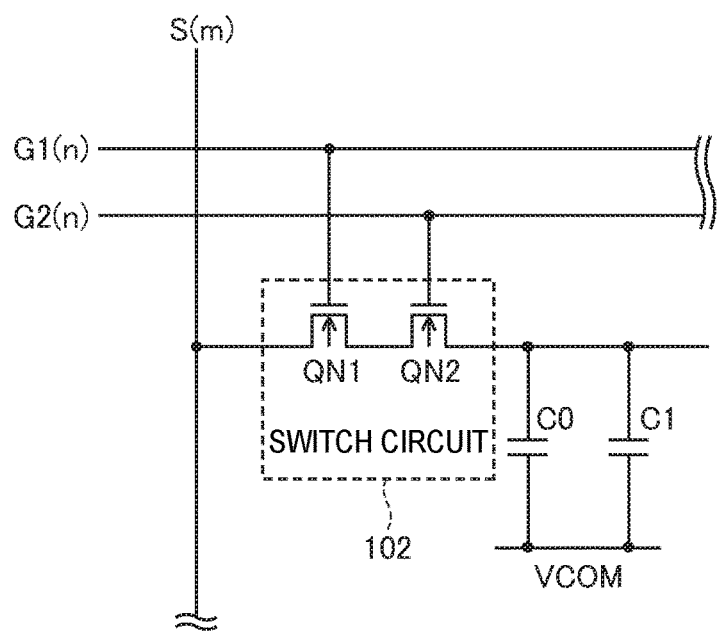
FIG. 3 is a circuit diagram showing a configuration example of a pixel circuit in an LCD panel.

FIG. 3 is a circuit diagram showing a configuration example of a pixel circuit in the LCD panel. In the LCD panel, a plurality of pixel circuits 101 of an active matrix type are arranged in a two-dimensional matrix. In the example shown in FIG. 3, each of the pixel circuits 101 includes a pixel element (liquid-crystal pixel) C0, which is equivalently represented as a capacitor, a switch circuit 102, which is connected between the pixel element C0 and a source line S(m) that is one of the plurality of source lines, and a holding capacitor C1, which is connected in parallel with the pixel element C0.

The pixel element C0 has an electrode, which is connected to the source line S(m) via the switch circuit 102, and a common electrode, to which the power supply voltage VCOM is supplied, the common electrode opposing the pixel electrode. The switch circuit 102 is constituted by a plurality of thin-film transistors (in FIG. 3, a first N-channel MOS transistor QN1 and a second N-channel MOS transistor QN2 are shown as an example), which are connected in series between the source line S(m) and the pixel electrode.

A transistor or parasitic capacitance on the interconnect may also be used as the holding capacitor C1. Note that, if an organic EL panel or the like is used in place of the LCD panel, the pixel circuit 101 includes, as a pixel element, a light-emitting element such as an organic light-emitting diode, a driving transistor for driving the light-emitting element, and so on.

It is known that, usually, if a fixed bias voltage continues to be applied between a gate and a source of a thin-film transistor (TFT), the threshold voltage of the TFT changes with the applied bias voltage acting as gate stress. If the threshold voltage of a TFT changes in the switch circuit 102, there is a concern that a leak current will flow or the switch circuit 102 will not completely enter the OFF state even when the switch circuit 102 is to enter the OFF state. On the other hand, it is also known that a threshold voltage that has changed due to gate bias is restored to its initial characteristics by applying a bias voltage whose polarity is opposite to the bias polarity.

In the pixel circuit 101, the switch circuit 102 includes a plurality of transistors QN1 and QN2 that are connected in series. The transistor QN1 has a gate that is electrically connected to the source line S(m) and is connected to a first gate line G1(n), and is controlled by the first gate line G1(n). The transistor QN2 has a gate that is electrically connected between the transistor QN1 and the pixel electrode of the pixel element C0 and is connected to a second gate line G2(n), and is controlled by the second gate line G2(n).

The switch circuit 102 transfers a gray-scale signal that is supplied to the source line S(m) to the pixel electrode of the pixel element C0 when both the transistors QN1 and QN2 have entered the ON state. The switch circuit 102 electrically separates the pixel electrode of the pixel element C0 from the source line S(m) when at least one of the transistors QN1 and QN2 has entered the OFF state.

For example, the gate line driving circuit 20 shown in FIG. 1 simultaneously controls the transistors QN1 and QN2 in the pixel circuits 101 on a sequentially selected line (pixel row) to enter the ON state. On the other hand, when no pixel row is selected, the gate line driving circuit 20 alternately controls the transistors QN1 and QN2 in the pixel circuits 101 on the plurality of pixel rows to enter the OFF state.

As a result, gate stress on the transistors QN1 and QN2 in the pixel circuits 101 is mitigated, and the change in the threshold voltage at the transistors QN1 and QN2 can be reduced. Note that, when the transistors QN1 and QN2 are alternately controlled to enter the OFF state, both the transistors QN1 and QN2 may also enter the OFF state in a period.

Source Line Driving Circuit

Figure 4:
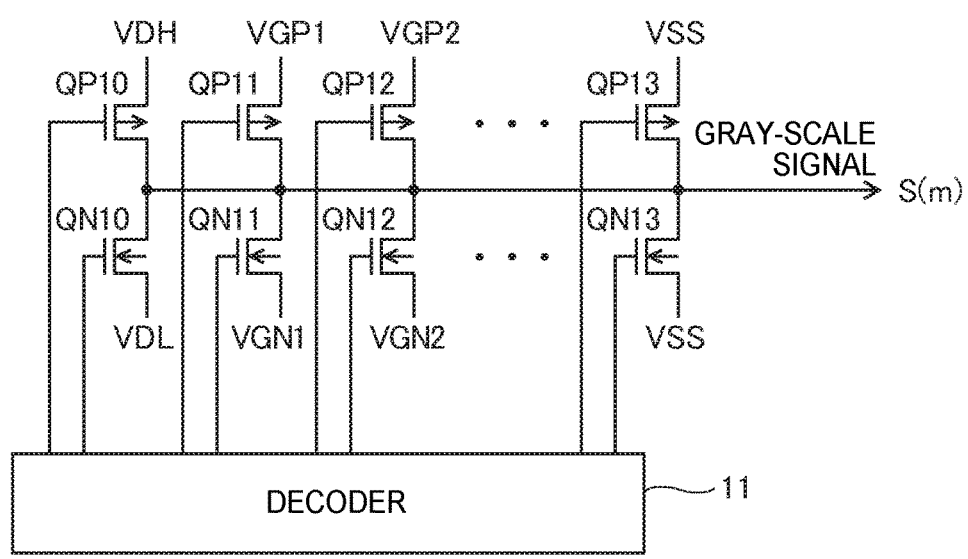
FIG. 4 is a circuit diagram showing a configuration example of a source line driving circuit shown in FIG. 1.

FIG. 4 is a circuit diagram showing a configuration example of the source line driving circuit shown in FIG. 1. FIG. 4 shows a configuration for supplying a gray-scale signal to one source line S(m) in the LCD panel. Each source line driving circuit 10 includes P-channel MOS transistors QP10 to QP13, N-channel MOS transistors QN10 to QN13, and a decoder 11. The number of transistors to be used in the source line driving circuit 10 is determined in accordance with the number of bits of image data.

For example, the power supply voltage VDH is supplied to a source of the transistor QP10. The power supply voltage VGP1 is supplied to a source of the transistor QP11. The power supply voltage VGP2 is supplied to a source of the transistor QP12. The power supply potential VSS is supplied to a source of the transistor QP13. Drains of the transistors QP10 to QN13 are connected to the source line S(m).

The power supply voltage VDL is supplied to a source of the transistor QN10. The power supply voltage VGN1 is supplied to a source of the transistor QN11. The power supply voltage VGN2 is supplied to a source of the transistor QN12. The power supply potential VSS is supplied to a source of the transistor QN13. Drains of the transistors QN10 to QN13 are connected to the source line S(m).

The decoder 11 decodes image data that is sequentially read from the RAM 80 (FIG. 1), thereby generating a plurality of control signals for selecting one of the plurality of power supply voltages VDH, VGP1, VGP2, . . . , VGN2, VGN1, and VDL, and supplies the generated control signals to gates of the transistors QP10 to QP13 and QN10 to QN13, respectively.

Thus, each source line driving circuit 10 selects one of the plurality of power supply voltages in accordance with the image data, and supplies the selected power supply voltage as the gray-scale signal to the source line S(m).

If a DC voltage continues to be applied to the LCD panel, properties thereof degrade. For this reason, each source line driving circuit 10 periodically inverts the polarity of the voltage applied to the pixel element C0 (FIG. 3) in accordance with the control signal supplied from the control circuit 70. For example, any one of a frame inversion method, in which the voltage polarity is inverted in every frame (or field), a line inversion method, in which the voltage polarity is inverted on every line, or a dot inversion method, in which the voltage polarity is inverted at every pixel, is used.

Gate Line Driving Circuit

Figure 5:
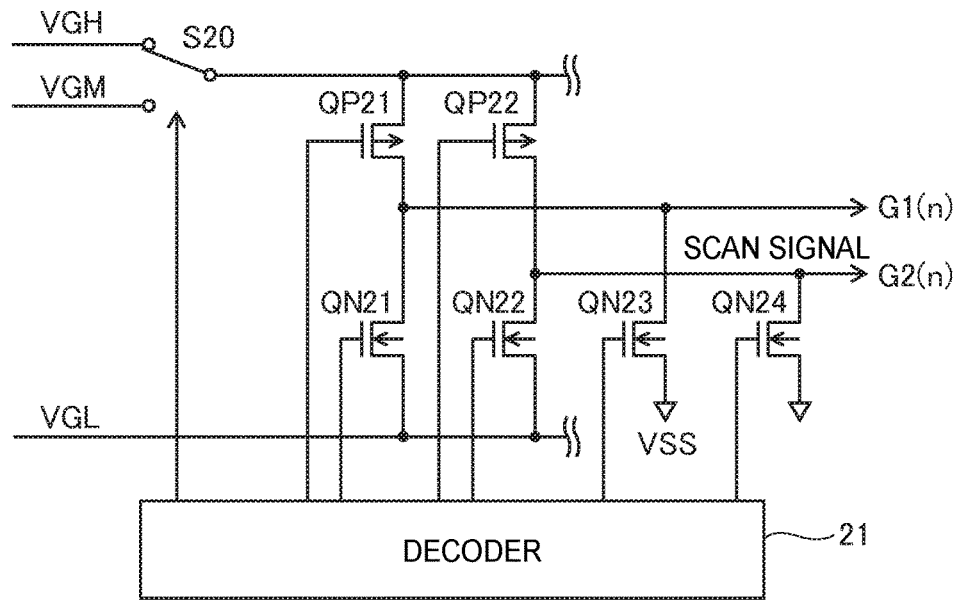
FIG. 5 is a circuit diagram showing a configuration example of a gate line driving circuit shown in FIG. 1.

FIG. 5 is a circuit diagram showing a configuration example of the gate line driving circuit shown in FIG. 1. FIG. 5 shows a configuration for supplying a scan signal to the first gate line G1(n) and the second gate line G2(n) in the LCD panel. The gate line driving circuit 20 includes P-channel MOS transistors QP21 to QP22, N-channel MOS transistors QN21 to QN24, a selector S20, and a decoder 21. The selector S20 is constituted by a plurality of P-channel MOS transistors, for example.

The decoder 21 controls the selector S20 so as to select the power supply voltage VGH, when sequentially selecting the plurality of lines. Thus, the power supply voltage VGH is supplied to sources of the transistors QP21 and QP22. Drains of the transistors QP21 and QP22 are connected to the first gate line G1(n) and the second gate line G2(n), respectively.

The power supply voltage VGL is supplied to sources of the transistors QN21 and QN22, and drains of the transistors QN21 and QN22 are connected to the first gate line G1(n) and the second gate line G2(n), respectively. The power supply potential VSS is supplied to sources of the transistors QN23 and QN24, and drains of the transistors QN23 and QN24 are connected to the first gate line G1(n) and the second gate line G2(n), respectively.

The decoder 21 includes a shift register, for example, and sequentially selects the plurality of lines by shifting scan data synchronously with a line clock signal that is supplied from the control circuit 70. As for the sequentially selected lines, the decoder 21 controls the transistors QP21 and QP22 to enter the ON state, and controls the transistors QN21 to QN24 to enter the OFF state. As a result, the gate line driving circuit 20 supplies a scan signal at a high level (power supply voltage VGH) to the gates of the transistors QN1 and QN2 (FIG. 3) in the pixel circuits 101, and simultaneously causes the transistors QN1 and QN2 to enter the ON state.

As for unselected lines, for example, the decoder 21 controls the transistor QP21 to enter the OFF state and also controls the transistor QN21 to enter the ON state, or controls the transistor QP22 to enter the OFF state and also controls the transistor QN22 to enter the ON state. As a result, the gate line driving circuit 20 supplies a scan signal at a low level (power supply voltage VGL) to the gates of the transistor QN1 or QN2 in the pixel circuits 101, and simultaneously causes the transistor QN1 or QN2 to enter the OFF state. Alternately, the gate line driving circuit 20 may also alternately cause the transistors QN1 and QN2 in the pixel circuits 101 to enter the OFF state.

On the other hand, when no line is selected, the decoder 21 controls the selector S20 so as to select the power supply voltage VGM, which is lower than the power supply voltage VGH. Thus, the power supply voltage VGM is supplied to the sources of the transistors QP21 and QP22.

The decoder 21 also temporarily controls the transistors QN23 and QN24 to enter the ON state, prior to supplying a scan signal to the first gate line G1(n) and the second gate line G2(n). Since electric charges that have been stored on the first gate line G1(n) and the second gate line G2(n) are then discharged to the interconnect with the power supply potential VSS, the electric charges that have been stored on the first gate line G1(n) and the second gate line G2(n) can be prevented from flowing back to the voltage generation circuit 54 (FIG. 1).

Next, the decoder 21 alternately repeats a period of causing QP21 and QN22 to enter the ON state and causing QP22 and QN21 to enter the OFF state and a period of causing QP21 and QN22 to enter the OFF state and causing QP22 and QN21 to enter the ON state. Thus, the gate line driving circuit 20 supplies two scan signals that vary in opposite phases between an intermediate level (power supply voltage VGM) and a low level (power supply voltage VGL) to the gates of the transistors QN1 and QN2, respectively, in the pixel circuits 101, and alternately sets the transistors QN1 and QN2 to enter the OFF state. This is for mitigating gate stress on the transistors QN1 and QN2 in the pixel circuits 101.

First Operation Example

Figure 6:
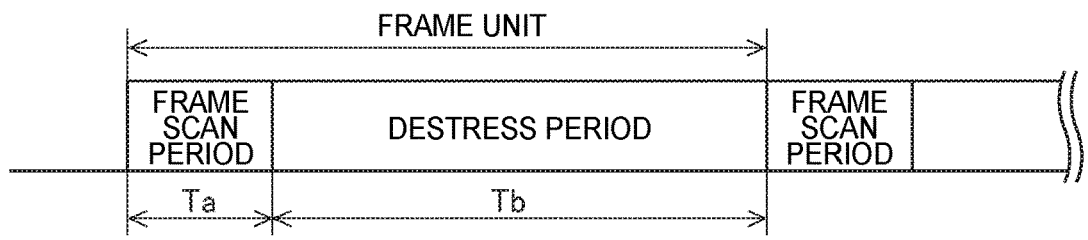
FIG. 6 is a timing chart showing a first operation example of the driving circuit shown in FIG. 1.

FIG. 6 is a timing chart showing a first operation example of the driving circuit shown in FIG. 1. In the first operation example, during a frame scan period Ta, the driving circuit 100 sequentially scans the plurality of lines in the LCD panel, and supplies gray-scale signals to the pixel element C0 and the holding capacitor C1 (FIG. 3) in the plurality of pixel circuits 101. During a predetermined period (destress period) Tb, the driving circuit 100 causes the plurality of pixel circuits 101 to hold the gray-scale signals while mitigating gate stress on the transistors QN1 and QN2 in the switch circuits 102 in the pixel circuits 101.

In FIG. 6, a total of the frame scan period Ta and the destress period Tb is denoted as a frame unit. The frame rate (frame frequency), which is an inverse number of the frame unit (frame period), is within a range from 0.1 Hz to 2 Hz, for example. When the frame frequency is 1 Hz, the frame scan period Ta and the destress period Tb may also be set to 50 ms and 950 ms, respectively. Timing parameters for defining the frame scan period Ta and the destress period Tb are stored in the register 71.

During the frame scan period Ta, when the gray-scale signals are supplied to the plurality of pixel elements, the control circuit 70 controls the switching circuit so as to set the voltage stabilization capability of the regulator to a predetermined level in the voltage generation circuits 51 to 53 and 57 (see FIG. 2). The voltage generation circuits 51 and 52 supply the power supply voltages VDH and VDL, respectively, to each source line driving circuit 10. The voltage generation circuit 53 supplies the power supply voltage VCOM to the common electrodes of the LCD panel. The voltage generation circuit 57 supplies the power supply voltages VGP and VGN to each source line driving circuit 10. Here, each of the voltage generation circuits 51, 52, and 57 corresponds to a first voltage generation circuit that supplies a power supply voltage to each source line driving circuit 10.

The control circuit 70 also controls the switching circuit so as to set the voltage stabilization capability of the regulator to a predetermined level in the voltage generation circuits 55 and 56. The voltage generation circuits 55 and 56 supply the power supply voltages VONREG and VOFREG, respectively, to the voltage boosting circuit 40. The voltage boosting circuit 40 boosts the power supply voltages VONREG and VOFREG, and supplies the boosted power supply voltages VGH and VGL to the gate line driving circuit 20. Here, the voltage generation circuit 56 corresponds to a second voltage generation circuit that supplies a power supply voltage to the gate line driving circuit 20.

The control circuit 70 also controls the switching circuit so as to set the voltage stabilization capability of the regulator to a level lower than a predetermined level, or to stop the operation of the regulator, in the voltage generation circuit 54. Even if the operation of the regulator stops in the voltage generation circuit 54, a current does not flow through the loads, and accordingly, the power supply voltage VGM is held by the smoothing capacitor C44. Furthermore, the control circuit 70 may also make the frequency of a voltage boosting clock signal used in a voltage boosting operation by the charge-pump circuits in the voltage generation circuit 40 that supplies the boosted power supply voltage to the voltage generation circuit 54, lower than that during the destress period Tb.

During the frame scan period Ta, the gate line driving circuit 20 sequentially scans the plurality of lines in the LCD panel, and supplies a scan signal at a high level (power supply voltage VGH) to two gate lines that correspond to a sequentially selected line, thereby causing the switch circuits 102 in the pixel circuits 101 on the sequentially selected line to enter the ON state. As a result, gray-scale signals are supplied from the source line driving circuits 10 to the pixel elements C0 and the holding capacitor C1 in the pixel circuits 101 on the sequentially selected line, via the plurality of source lines.

Also, the gate line driving circuit 20 supplies a scan signal at a low level (power supply voltage VGL) to at least one of the two gate lines that correspond to an unselected line, thereby causing the switch circuits 102 in the pixel circuits 101 on the unselected line to enter the OFF state. As a result, the gray-scale signals are supplied to the pixel elements C0 and the holding capacitor C1 in the pixel circuits 101 on the unselected selected line.

On the other hand, during the destress period Tb, the gate line driving circuit 20 keeps the switch circuits 102 in the plurality of pixel circuits 101 in the OFF state, and an immediately previous image is thus displayed as-is on the LCD panel. Accordingly, the source line driving circuits 10 do not supply the gray-scale signals to the pixel elements C0 in the plurality of pixel circuits 101. When the gray-scale signals are not supplied to the plurality of pixel elements C0, the control circuit 70 controls the switching circuit so as to set the voltage stabilization capability of the regulator to a level lower than a predetermined level, or to stop the operation of the regulator, in the voltage generation circuits 51 to 53, 55, and 57.

Even if the operation of the regulator stops in the voltage generation circuits 51 to 53, 55, and 57, a current does not flow through the loads. Accordingly, the power supply voltages VDH, VDL, VCOM, VONREG, VGP, VGN, and VGH are held by the smoothing capacitors C41 to C43, C45, C47, C48 and C21, respectively.

Furthermore, the control circuit 70 may also make the frequency of the voltage boosting clock signal used the voltage boosting operation by the charge-pump circuits in the voltage boosting circuit 40 that supplies the boosted power supply voltages to the voltage generation circuits 51 to 53, 55, and 57, and the charge-pump circuit in the voltage boosting circuit 40 that generates the power supply voltage VGH, lower than that during the frame scan period Ta.

The control circuit 70 controls the switching circuit so as to set the voltage stabilization capability of the regulator to a predetermined level, in the voltage generation circuits 54 and 56. The voltage generation circuit 54 supplies the power supply voltage VGM to the gate line driving circuit 20. The voltage generation circuit 56 supplies the power supply voltage VOFREG to the voltage boosting circuit 40. The voltage boosting circuit 40 boosts the power supply voltage VOFREG, and supplies the boosted power supply voltage VGL to the gate line driving circuit 20.

During the destress period Tb, the gate line driving circuit 20 supplies two scan signals that vary in opposite phases between the intermediate level (power supply voltage VGM) and the low level (power supply voltage VGL) to the gate line in each set. Thus, the switch circuits 102 provided in the pixel circuits 101 on the plurality of lines enter the OFF state.

Note that, even during the frame scan period Ta, the gates and sources of the transistors QN1 and QN2 in the pixel circuits 101 do not need to be driven during a front porch period and a back porch period. Accordingly, the gray-scale signals are not supplied to the pixel elements C0 in the plurality of pixel circuits 101 in the LCD panel.

For this reason, during the front porch period and the back porch period, the control circuit 70 may also control the switching circuit so as to set the voltage stabilization capability of the regulator to a level lower than that at the time of supplying the gray-scale signals, or stop the operation of the regulator, in the voltage generation circuits 51 to 53 and 57, for example.

Furthermore, the control circuit 70 may also make the frequency of the voltage boosting clock signal used in the voltage boosting operation by the charge-pump circuits in the voltage boosting circuit 40 that supply the boosted power supply voltages to the voltage generation circuits 51 to 53 and 57, and a plurality of charge-pump circuits in the voltage boosting circuit 40 that generate the power supply voltages VGH and VGL, lower than that at the time of supplying the gray-scale signals.

According to the first operation example, when the gray-scale signals are not supplied to the plurality of pixel elements C0, the voltage stabilization capability of the regulator for supplying a stabilized power supply voltage to the source line driving circuits 10 is set to a level lower than that at the time of supplying the gray-scale signals, or the operation of the regulator is stopped. Accordingly, power consumption can be reduced without degrading the capability to drive the LCD panel.

Also, when the gray-scale signals are not supplied to the plurality of pixel elements C0, the voltage stabilization capability of the regulator for supplying a stabilized power supply voltage to the common electrodes of the LCD panel is set to a level lower than that at the time of supplying the gray-scale signals, or the operation of the regulator is stopped. Accordingly, power consumption can be reduced without degrading the capability to drive the LCD panel.

To enhance the power consumption reducing effect, it is favorable to set the voltage stabilization capability of the regulator to a level lower than a predetermined level, or stop the operation of the regulator, immediately after the destress period Tb has started. On the other hand, to improve transient response, it is favorable to set the voltage stabilization capability of the regulator to the predetermined level immediately before the timing at which the destress period Tb ends and the frame scan period Ta starts (e.g. one pulse before a dot clock signal).

It is also favorable to set the voltage stabilization capability of the regulator to a level lower than the predetermined level, or to stop the operation of the regulator, immediately after the front porch period or the back porch period has started. On the other hand, to improve transient response, it is favorable to set the voltage stabilization capability of the regulator to the predetermined level immediately before the timing at which the front porch period or the back porch period ends and an image starts to be updated (e.g. one pulse before a dot clock signal).

Furthermore, during the first period of alternately causing the transistors QN1 and QN2 in the pixel circuits 101 to enter the OFF state, the driving circuit 100 may also stop the first voltage generation circuit for supplying a power supply voltage to the source line driving circuits 10, and operate the second voltage generation circuit for supplying a power supply voltage to the gate line driving circuit 20. During a second period of simultaneously causing the transistors QN1 and QN2 to enter the ON state, the driving circuit 100 may also operate the first voltage generation circuit and the second voltage generation circuit. As a result, during the first period of alternately causing the transistors QN1 and QN2 to enter the OFF state, the first voltage generation circuit for supplying the power supply voltage to the source line driving circuits 10 stops. Accordingly, power consumption can be reduced while displaying an immediately previous image on the LCD panel.

Second Operation Example

Figure 7:
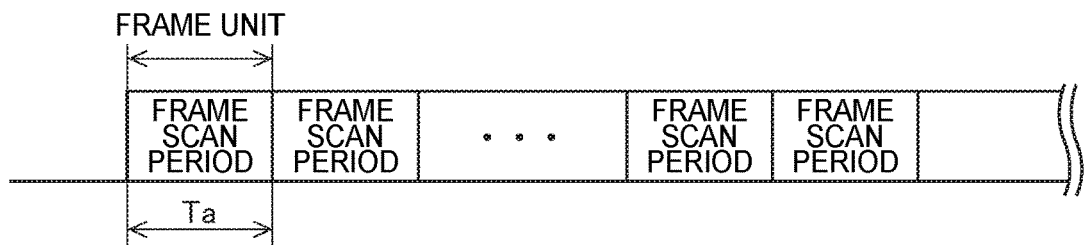
FIG. 7 is a timing chart showing a second operation example of the driving circuit shown in FIG. 1.

FIG. 7 is a timing chart showing a second operation example of the driving circuit shown in FIG. 1. In the second operation example, the destress period Tb shown in FIG. 6 is not provided, and accordingly, the frame scan period Ta corresponds to the frame unit.

The frame rate (frame frequency), which is an inverse number of the frame unit (frame period), is within a range from 40 Hz to 60 Hz, for example. Timing parameters for defining the frame scan period Ta are stored in the register 71 shown in FIG. 1. During the frame scan period Ta, the driving circuit 100 sequentially scans the plurality of lines in the LCD panel, and supplies the gray-scale signals to the plurality of pixel circuits 101 (FIG. 3).

The control circuit 70 may also switch between a first mode (low power consumption mode) of driving the LCD panel at a predetermined frame rate as shown in FIG. 6, and a second mode (normal mode) of driving the LCD panel at a frame rate that is higher than the predetermined frame rate, as shown in FIG. 7. For example, images such as those of a time display are displayed on the LCD panel in the first mode, and images such as those of a stopwatch or a smart watch are displayed on the LCD panel in the second mode.

In this case, in the first mode, when the gray-scale signals are supplied to the plurality of pixel elements C0 (FIG. 3), the control circuit 70 controls the switching circuit so as to set the voltage stabilization capability of the regulator to a predetermined level in the voltage generation circuits 51 to 53 and 57. In the second mode, when the gray-scale signals are supplied to the plurality of pixel elements C0, the control circuit 70 controls the switching circuit so as to set the voltage stabilization capability of the regulator to a level that is higher than the predetermined level, in the voltage generation circuits 51 to 53 and 57.

Also, in the first mode, when the gray-scale signals are supplied to the plurality of pixel elements C0, the control circuit 70 controls the switching circuit so as to set the voltage stabilization capability of the regulator to a predetermined level, in the voltage generation circuits 55 and 56. In the second mode, when the gray-scale signals are supplied to the plurality of pixel elements C0, the control circuit 70 controls the switching circuit so as to set the voltage stabilization capability of the regulator to a level that is higher than the predetermined level, in the voltage generation circuits 55 and 56.

By thus switching between the first mode (low power consumption mode) and the second mode (normal mode), the capability to drive the LCD panel can be kept at a high level in the second mode. In the first mode in which the frame rate is lower than that in the second mode, power consumption of the driving circuit 100 can be made lower than that in the second mode.

Third Operation Example

In the above-described first operation example and second operation example, the voltage stabilization capability of the regulators is changed in accordance with the operation timing of the driving circuit 100. Meanwhile, in the third example, the voltage stabilization capability of the regulators is changed by monitoring the output voltages of the voltage generation circuits.

For example, a first comparator for comparing the power supply voltage VDH generated by the voltage generation circuit 51 with a first threshold, and a second comparator for comparing the power supply voltage VDH with a second threshold are provided in the driving circuit 100 shown in FIG. 1. Here, a relationship in which the first threshold<the second threshold holds. Upon a comparison result signal indicating that the power supply voltage VDH is smaller than the first threshold being input from the first comparator, the control circuit 70 controls the switching circuit so as to set the voltage stabilization capability of the regulator to a predetermined level in the voltage generation circuit 51.

Upon a comparison result signal indicating that the power supply voltage VDH is greater than the second threshold being input from the second comparator, the control circuit 70 controls the switching circuit so as to set the voltage stabilization capability of the regulator to a level that is lower than a predetermined level in the voltage generation circuit 51, or to stop the operation of the regulator. Thus, the voltage generation circuit 51 can generate the power supply voltage VDH in a range that is determined by the first threshold and the second threshold. The same applies to the voltage generation circuits 52 to 57.

Electronic Device

Figure 8:
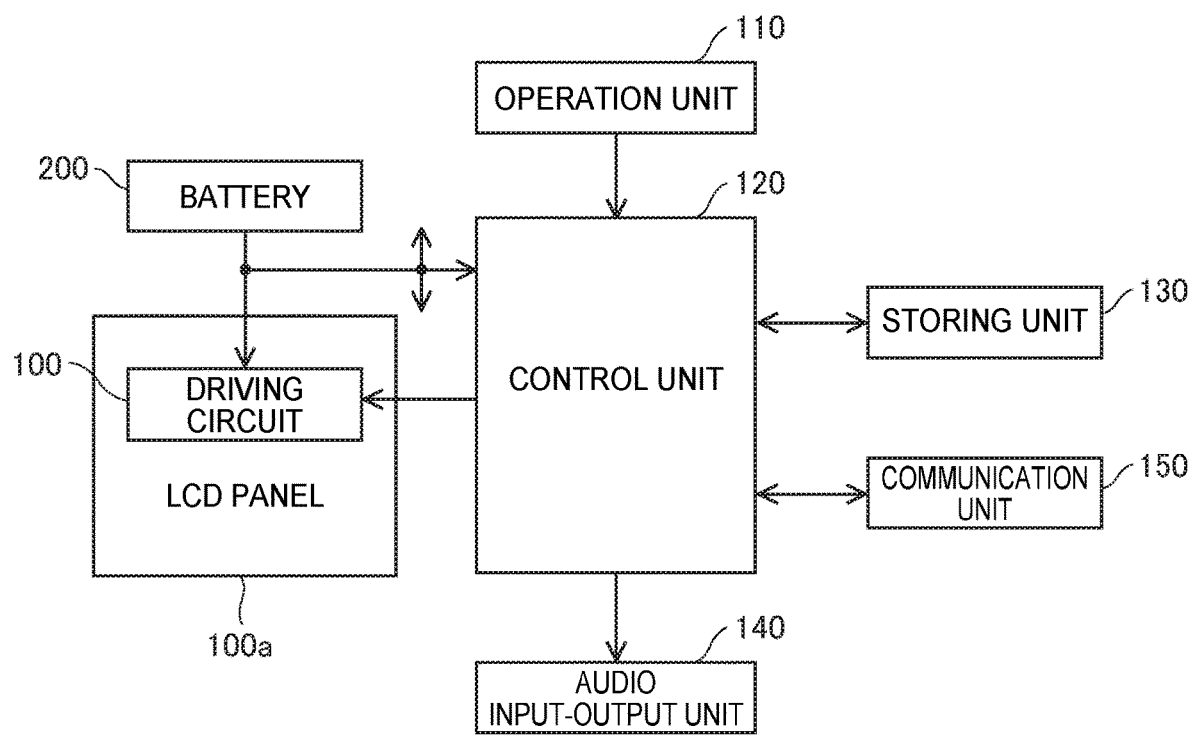
FIG. 8 is a block diagram showing a configuration example of an electronic device according to an embodiment of the invention.

Next, an electronic device according to an embodiment of the invention will be described, FIG. 8 is a block diagram showing a configuration example of the electronic device according to an embodiment of the invention. FIG. 8 shows a configuration of a cellular phone as an example of the electronic device. As shown in FIG. 8, the cellular phone includes the driving circuit 100 according to an embodiment of the invention, an electro-optical panel (in FIG. 8, an LCD panel 100a is shown as an example), an operation unit 110, a control unit 120, a storing unit 130, an audio input-output unit 140, and a communication unit 150. The cellular phone operates while being supplied with a power supply voltage from a battery 200. Note that some of the constituent elements shown in FIG. 8 may be omitted or altered, or a constituent element other than the constituent elements shown in FIG. 8 may also be added.

The driving circuit 100 is mounted, together with the voltage boosting capacitors C11, C12, . . . and the smoothing capacitors C21 to C48 shown in FIG. 1, on the LCD panel 100a. The driving circuit 100 boosts and stabilizes the power supply voltage supplied from the battery 200 to generate a plurality of power supply voltages, and displays an image on the LCD panel 100a by driving the LCD panel 100a based on image data or the like that is supplied from the control unit 120.

The operation unit 110 is an input device, which includes a button switch, a touch sensor, or the like, for example, and outputs an operation signal that corresponds to a user operation to the control unit 120. The control unit 120 includes a CPU, for example, and executes various kinds of signal processing and control processing in accordance with a program. For example, the control unit 120 processes image data and audio data in accordance with the operation signal that is supplied from the operation unit 110, and controls the communication unit 150 in order to communicate with an external device.

The storing unit 130 includes a ROM (Read Only Memory) and a RAM (Random Access Memory), for example. The ROM stores programs, data, and the like with which the CPU executes various kinds of signal processing and control processing. The RAM is used as a work area for the CPU, and temporarily stores programs and data that are read out from the RAM, data that is input using the operation unit 110, the results of calculation executed in accordance with a program by the CPU, or the like.

The audio input-output unit 140 includes a microphone and an ADC (analog/digital converter), as well as a DAC (digital/analog converter) and a speaker, or the like, for example. The microphone outputs an audio signal that corresponds to an applied sound wave, and the ADC converts an analog audio signal output from the microphone to audio data and supplies this audio data to the control unit 120. The DAC converts audio data supplied from the control unit 120 to an analog audio signal and supplies this analog audio signal to the speaker, and the speaker generates a sound wave based on the audio signal supplied from the DAC.

The communication unit 150 is constituted by an analog circuit and a digital circuit, for example. The communication unit 150 wirelessly communicates with a cellular base station that is connected to a cellular telephone network, thereby transmitting, to the cellular base station, an audio data supplied from the control unit 120, and supplying, to the control unit 120, audio data received from the cellular base station. At this time, the control unit 120 processes the audio data supplied from the ADC in the audio input-output unit 140 and supplies the processed audio data to the communication unit 150, and processes the audio data supplied from the communication unit 150 and supplies the processed audio data to the audio input-output unit 140.

The communication unit 150 wirelessly communicates with a wireless access point that is connected to the Internet, thereby supplying image data and audio data received from the wireless access point to the control unit 120. At this time, the control unit 120 processes the image data supplied from the communication unit 150 and outputs the processed image data to the driving circuit 100, and processes the audio data supplied from the communication unit 150 and outputs the processed audio data to the audio input-output unit 140.

In addition to the cellular phone, for example, a mobile device such as a mobile information terminal, a clock, a timer, an audio device, a digital still camera, a digital movie device, a head-mounted display, a personal computer, an in-vehicle device (navigation device etc.), a calculator, an electronic dictionary, an electronic game machine, a robot, a measurement instrument, a medical device (e.g. electronic clinical thermometer, a hemomanometer, a blood glucose monitoring system, a cardiograph, an ultrasonic diagnostic device, an electronic endoscope), and the like, also correspond to the electronic device.

According to this embodiment, it is possible to provide an electronic device in which power consumption is reduced while maintaining favorable image quality, by using the driving circuit 100 capable of reducing power consumption, without degrading the capability to drive the LCD panel 100a.

The above embodiment has described the case where two N-channel MOS transistors that are connected in series are used in the switch circuit in each pixel circuit. However, one N-channel MOS transistor may also be used in the switch circuit, or P-channel MOS transistors may also be used in place of the N-channel MOS transistors. Thus, the invention is not limited to the above-described embodiment, and may be modified in various manners within the technical idea of the invention by a person with common knowledge in the relevant technical field.

What is claimed is:

1. A driving circuit for driving an electro-optical panel, the electro-optical panel including a plurality of scan lines, a plurality of data lines, and a plurality of pixel circuits, each of the plurality of pixel circuits including a plurality of pixel elements, the plurality of pixel circuits being provided at corresponding intersections of the plurality of scan lines and the plurality of data lines, the driving circuit comprising:
   a data line driving circuit that supplies a gray-scale signal to the plurality of data lines;
   a regulator that stabilizes a supplied power supply voltage and supplies the stabilized power supply voltage to a smoothing capacitor and the data line driving circuit;
   a switching circuit that switches a connection state of a plurality of circuit elements that constitute the regulator; and
   a control circuit that controls the switching circuit,
   wherein the control circuit controls the switching circuit to:
      set a voltage stabilization capability of the regulator to a predetermined level when the gray-scale signal is supplied to the plurality of pixel elements, and
      set the voltage stabilization capability of the regulator to a level lower than the predetermined level or to stop an operation of the regulator, when the gray-scale signal is not supplied to the plurality of pixel elements.

2. The driving circuit according to claim 1, wherein
   in a first mode of driving the electro-optical panel at a predetermined frame rate, the control circuit controls the switching circuit to set the voltage stabilization capability of the regulator to a predetermined level, when the gray-scale signal is supplied to the plurality of pixel elements, and,
   in a second mode of driving the electro-optical panel at a frame rate higher than the predetermined frame rate, the control circuit controls the switching circuit to set the voltage stabilization capability of the regulator to a level higher than the predetermined level, when the gray-scale signal is supplied to the plurality of pixel elements.

3. An electronic device comprising:
   the driving circuit according to claim 2; and
   the electro-optical panel driven by the driving circuit.

4. The driving circuit according to claim 1,
   wherein, during a front porch period and a back porch period, the control circuit controls the switching circuit to set the voltage stabilization capability of the regulator to a level lower than the predetermined level or to stop the operation of the regulator.

5. An electronic device comprising:
   the driving circuit according to claim 4; and
   the electro-optical panel driven by the driving circuit.

6. The driving circuit according to claim 1,
   wherein the regulator includes:
      a differential amplifier circuit for amplifying a difference between a reference voltage and an output voltage of the regulator;
      a plurality of constant current transistors for supplying a constant current to the differential amplifier circuit; and
      a plurality of output transistors for generating the output voltage of the regulator in accordance with an output signal of the differential amplifier circuit, and
   the switching circuit includes:
      a first selection circuit that selects the number of constant current transistors that supplies the constant current to the differential amplifier circuit; and
      a second selection circuit that selects the number of output transistors for generating the output voltage of the regulator.

7. An electronic device comprising:
   the driving circuit according to claim 6; and
   the electro-optical panel driven by the driving circuit.

8. The driving circuit according to claim 1, further comprising:
   a second regulator that stabilizes a supplied power supply voltage and supplies the stabilized power supply voltage to a second smoothing capacitor and a common electrode of the electro-optical panel; and a second switching circuit that switches a connection state of a plurality of circuit elements that constitute the second regulator, wherein the control circuit controls the second switching circuit to:

set a voltage stabilization capability of the second regulator to a predetermined level when the gray-scale signal is supplied to the plurality of pixel elements, and set the voltage stabilization capability of the second regulator to a level lower than the predetermined level or to stop an operation of the second regulator, when the gray-scale signal is not supplied to the plurality of pixel elements.

9. An electronic device comprising:

the driving circuit according to claim 8; and the electro-optical panel driven by the driving circuit.

10. The driving circuit according to claim 1, further comprising:

a scan line driving circuit that supplies a scan signal to the plurality of scan lines;

a third regulator that stabilizes a supplied power supply voltage and supplies the stabilized power supply voltage to a third smoothing capacitor and a voltage boosting circuit; and a third switching circuit that switches a connection state of a plurality of circuit elements that constitute the third regulator, wherein the voltage boosting circuit boosts the power supply voltage stabilized by the third regulator, and supplies the boosted power supply voltage to a fourth smoothing capacitor and the scan line driving circuit, in a first mode of driving the electro-optical panel at a predetermined frame rate, the control circuit controls the third switching circuit to set a voltage stabilization capability of the third regulator to a predetermined level, when the gray-scale signal is supplied to the plurality of pixel elements, and in a second mode of driving the electro-optical panel at a frame rate higher than the predetermined frame rate, the control circuit controls the third switching circuit to set the voltage stabilization capability of the third regulator to a level higher than the predetermined level, when the gray-scale signal is supplied to the plurality of pixel elements.

11. An electronic device comprising:

the driving circuit according to claim 10; and the electro-optical panel driven by the driving circuit.

12. The driving circuit according to claim 10, each of the plurality of pixel circuits including a plurality of transistors connected in series between one of the plurality of data lines and one of the plurality of pixel elements, and wherein the scan line driving circuit simultaneously controls the plurality of transistors in pixel circuits on a sequentially selected pixel row to enter an ON state, and when no pixel row is selected, the scan line driving circuit alternately controls the plurality of transistors on pixel circuits on a plurality of pixel rows to enter an OFF state.

13. An electronic device comprising:

the driving circuit according to claim 12; and the electro-optical panel driven by the driving circuit.

14. An electronic device comprising:

the driving circuit according to claim 1; and the electro-optical panel driven by the driving circuit.

15. A driving circuit for driving an electro-optical panel, the electro-optical panel including a first scan line, a second scan line, a plurality of data lines, and a plurality of pixel circuits, each of the plurality of pixel circuits being provided at corresponding intersections of the first and second scan lines and the plurality of data lines, each of the plurality of pixel circuits including a pixel electrode, a common electrode, a first transistor that is electrically connected to one of the plurality of data lines and is controlled by the first scan line, and a second transistor that is electrically connected between the first transistor and the pixel electrode and is controlled by the second scan line, the driving circuit comprising:

a data line driving circuit that supplies a gray-scale signal to the plurality of data lines;

a first voltage generation circuit that supplies a power supply voltage to the data line driving circuit;

a scan line driving circuit that supplies a scan signal to the first and second scan lines; and a second voltage generation circuit that supplies a power supply voltage to the scan line driving circuit, wherein, during a first period of alternately causing the first transistor and the second transistor to enter an OFF state, the first voltage generation circuit is stopped and the second voltage generation circuit is operated, and during a second period of simultaneously causing the first transistor and the second transistor to enter an ON state, the first voltage generation circuit and the second voltage generation circuit are operated.

16. An electronic device comprising:

the driving circuit according to claim 15; and the electro-optical panel driven by the driving circuit.

17. A driving circuit for driving an electro-optical panel, the electro-optical panel including a plurality of scan lines, a plurality of data lines, and a plurality of pixel circuits, each of the plurality of pixel circuits including a plurality of pixel elements, the plurality of pixel circuits being provided at corresponding intersections of the plurality of scan lines and the plurality of data lines, the driving circuit comprising:

a data line driving circuit that supplies a gray-scale signal to the plurality of data lines;

a regulator that stabilizes a supplied power supply voltage and supplies the stabilized power supply voltage to a smoothing capacitor and the data line driving circuit;

a switching circuit that switches a connection state of a plurality of circuit elements that constitute the regulator; and a control circuit that controls the switching circuit, wherein when the gray-scale signal is supplied to the plurality of pixel elements, the control circuit controls the switching circuit to switch the connection state of the plurality of circuit elements that constitute the regulator so as to set a voltage stabilization capability of the regulator to a predetermined level, and wherein when the gray-scale signal is not supplied to the plurality of pixel elements, the control circuit controls the switching circuit to switch the connection state of the plurality of circuit elements that constitute the regulator so as to set the voltage stabilization capability of the regulator to a level lower than the predetermined level or to stop an operation of the regulator.

\* \* \* \* \*